(12) United States Patent
Kajigaya

(10) Patent No.: US 8,966,153 B2
(45) Date of Patent: *Feb. 24, 2015

(54) SEMICONDUCTOR MEMORY DEVICE AND INFORMATION DATA PROCESSING APPARATUS INCLUDING THE SAME

(71) Applicant: PS4 Luxco S.a.r.l., Luxembourg (LU)

(72) Inventor: Kazuhiko Kajigaya, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

This patent is subject to a terminal disclaimer.

(21) Appl. No.: 14/087,818

(22) Filed: Nov. 22, 2013

(65) Prior Publication Data

US 2014/0082306 A1    Mar. 20, 2014

Related U.S. Application Data

(63) Continuation of application No. 12/987,784, filed on Jan. 10, 2011, now Pat. No. 8,621,135.

(30) Foreign Application Priority Data

Jan. 18, 2010  (JP) .................................. 2010-007831
Sep. 21, 2010  (JP) .................................. 2010-210985

(51) Int. Cl.
*G06F 12/00*       (2006.01)
*G11C 7/10*        (2006.01)
*G11C 11/408*      (2006.01)

(52) U.S. Cl.
CPC ............ *G11C 7/1042* (2013.01); *G11C 7/1012* (2013.01); *G11C 7/1018* (2013.01); *G11C 11/4087* (2013.01)
USPC .......................................................... 711/5

(58) Field of Classification Search
CPC   G06F 12/0853; G11C 7/1042; G11C 7/1012; G11C 7/1018; G11C 11/4087
See application file for complete search history.

(56) References Cited

U.S. PATENT DOCUMENTS

| 5,831,924 A | 11/1998 | Nitta et al. |
| 5,903,514 A | 5/1999 | Sawada |
| 6,819,323 B2 | 11/2004 | Sunaga |
| 6,965,534 B2 | 11/2005 | Kim |

(Continued)

FOREIGN PATENT DOCUMENTS

| JP | H05-334869 A | 12/1993 |
| JP | H09-73776 A | 3/1997 |

(Continued)

OTHER PUBLICATIONS

Notice of Allowance issued Aug. 30, 2013 in Parent U.S. Appl. No. 12/987,784.

Non-final Office Action issued Mar. 27, 2013 in Parent U.S. Appl. No. 12/987,784.

*Primary Examiner* — Hiep Nguyen

(74) *Attorney, Agent, or Firm* — Sughrue Mion, PLLC

(57) ABSTRACT

A semiconductor memory device includes a plural number of data input/output pins, a plural number of banks, in each of which a plural number of the information data is stored, a selector and a control circuit. In a first access mode, the control circuit simultaneously accesses the multiple banks in response to a single read-out command or to a single write-in command from outside. In the first access mode, the selector coordinates a plurality of data input/output pins with the multiple banks in a predetermined relationship.

8 Claims, 17 Drawing Sheets

(56) References Cited

U.S. PATENT DOCUMENTS

| | | |
|---|---|---|
| 7,321,949 B2 | 1/2008 | An |
| 7,512,733 B2 | 3/2009 | Nakamura et al. |
| 8,127,069 B2 | 2/2012 | An |
| 8,209,497 B2 * | 6/2012 | Kajigaya .................. 711/149 |
| 2001/0017628 A1 | 8/2001 | Sunaga |
| 2005/0259478 A1 | 11/2005 | An |
| 2007/0294462 A1 | 12/2007 | An |
| 2009/0240897 A1 | 9/2009 | Kajigaya |

FOREIGN PATENT DOCUMENTS

| | | |
|---|---|---|
| JP | 11-86541 A | 3/1999 |
| JP | 2001-243771 A | 9/2001 |
| JP | 2005-317176 A | 11/2005 |
| JP | 2006-313646 A | 11/2006 |

* cited by examiner

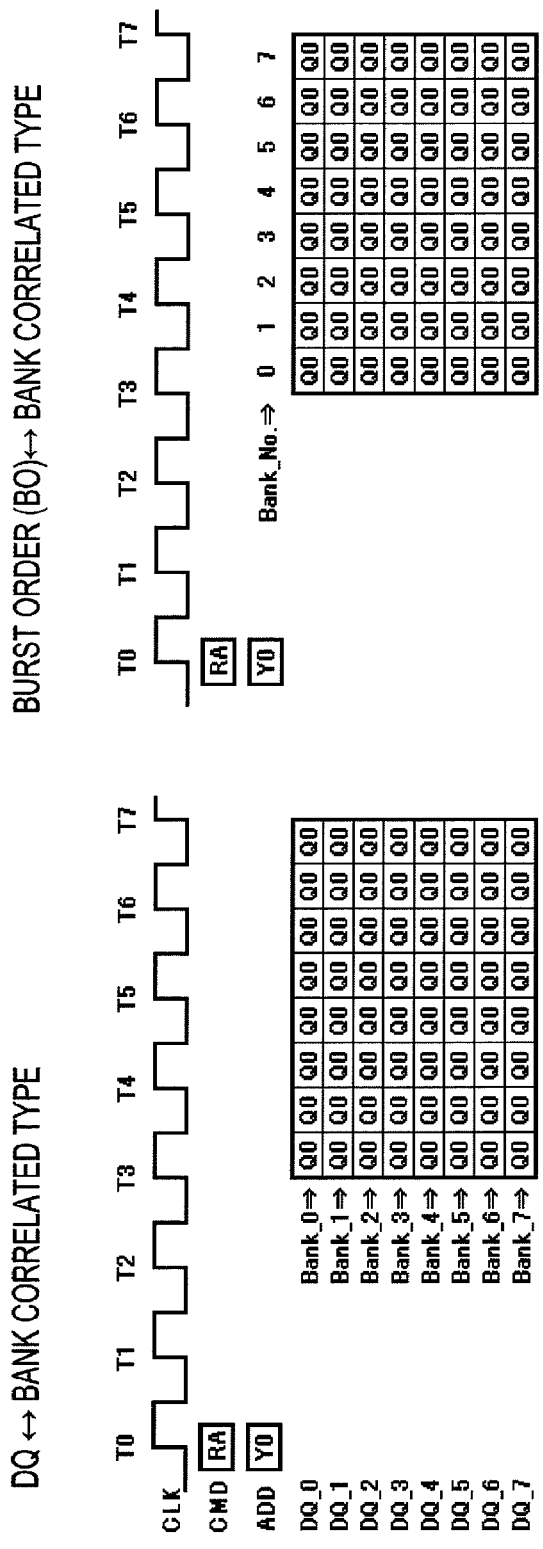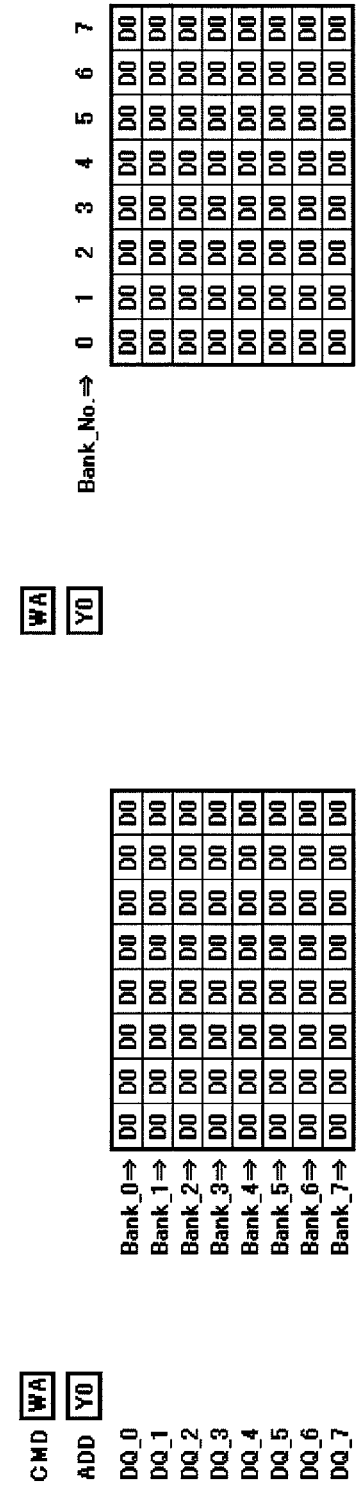

SEMICONDUCTOR MEMORY DEVICE AND INFORMATION DATA PROCESSING APPARATUS INCLUDING THE SAME

CROSS-REFERENCE TO RELATED APPLICATIONS

This application is a Continuation Application of U.S. patent application Ser. No. 12/987,784 filed Jan. 10, 2011, which claims priority from Japanese Patent Applications No. 2010-007831, filed on Jan. 18, 2010 and No. 2010-210985, filed on Sep. 21, 2010, the contents of all of which are incorporated herein by reference in their entirety. This invention relates to a semiconductor memory device and, more particularly, to a semiconductor memory device having a DRAM function capable of coping with scatter-gather operations and an information data processing apparatus including the same.

BACKGROUND

In a synchronous DRAM, viz., an SDRAM (Synchronous Dynamic Random Access Memory), the read-out/write-in operation is carried out by setting a memory bank to an activated or opened state and receiving a read-out or write-in command, a bank address and a column address for in-page data of the opened memory bank. The read-out or write-in operations may be carried out in succession for a plurality of the memory banks that are in opened states. This operation is termed a bank interleaved access.

A multi-bank semiconductor memory device, that is, a semiconductor memory device with a plurality of banks is described for example in Patent Document 1.
[Patent Document 1]
JP Patent Kokai Publication No. JP-A-11-086541A

SUMMARY

The entire disclosure of the above mentioned Patent Document is incorporated herein by reference thereto. The following analyses are given by the present invention.

FIG. 13A shows a waveform of a bank interleaved operation (read-out) for a double data rate 3 (DDR3) SDRAM of an x8-bit configuration having a burst length of 8. FIG. 14A shows a waveform of a bank interleaved operation (write-in). Commands (CMDs) RO and WO denote, respectively, a read-out command and a write-in command for a bank 0. An address (ADD) represents a column address of an open page of a selected bank, and an initial address of a burst access is entered to a location for a column address.

In the bank interleaved access, in-page data of each bank are accessed in a burst mode. Thus, in a case shown in FIGS. 13A to 13C and FIGS. 14A to 14C, 64 bits of data are accessed at a time. In general, in an application for image processing or matrix processing, rows of data in a two-dimensional data array configuration are placed in a distributed manner for accessing in each page of each of the multiple banks (scatter-gather access). Hence, an access in the row direction of a two-dimensional array is an access to the same pages, with the result that read-out/write-in can be performed by a single access.

On the other hand, an access along the column direction is an access performed sequentially to different banks. Such access is the bank interleaved access. Hence, even if the data size of a matrix to be accessed is small, for example, only 8-bit data of a column address 0 in FIG. 13A or 14A is needed, an access in terms of 64 bits as a unit is to be performed. Thus, to access 8×8 size matrix data, for example, the eight banks need to be sequentially accessed to read or write 64×8 bit data. In this case, a problem is raised that the total of data needs to be read or written by an extremely time-consuming operation. Moreover, since unneeded data is read or written, power consumption of the DRAM, data bus and the controller is increased.

FIG. 13B or 14B show an access mode known as a burst chop. In this access mode, an 8-bit burst length is severed into 4-bit lengths, thereby reducing the power consumption of the DRAM, data bus and the controller to a more or less extent. However, even with this access mode, it is not possible to reduce the time needed in reading or writing data because unneeded data are written or read out.

Such an example of execution has also been proposed in which the banks are split into a plurality of groups so that interleaved access between banks belonging to different groups may be carried out at a time interval shorter than the usual interval. FIGS. 13C and 14C show waveforms of the interleaved access mode between different bank groups. With this access mode, the power consumption as well as the time needed in reading and writing data may be halved. This access mode however suffers a drawback that the power consumption and the operation time amount to four times those in case of the access mode of accessing only needed data.

Therefore, there is a need in the art to reduce access time as well as power consumption in case each row of a two-dimensional data array is placed distributed in pages in a plurality of banks and is accessed in a scatter-gather access mode.

According to a first aspect of the present invention, there is provided a semiconductor memory device comprising:
a plurality of data input/output pins;
a plurality of banks that each store a plurality of information data;
a selector; and
a control circuit, wherein
the control circuit simultaneously accesses said plurality of banks, in response to a single read-out command or a single write-in command from outside, by way of a first access mode; and
the selector coordinates said plurality of data input/output pins and said plurality of banks in a predetermined relationship by way of the first access mode.

According to a second aspect of the present invention, there is provided a semiconductor memory device comprising:
a plurality of data input/output pins;
a plurality of banks that each store a plurality of information data;
a selector; and
a control circuit, wherein
the control circuit simultaneously accesses said plurality of banks, in response to a single read-out command or a single write-in command from outside, by way of a second access mode; and
the selector coordinates an access order for said plurality of information data via said plurality of data input/output pins in a burst mode with said plurality of banks in a predetermined relationship, by way of said second access mode.

The present invention provides the following advantage, but not restricted thereto. In the semiconductor memory device according to the present invention, in case each row of a two-dimensional data array is placed distributed in pages in a plurality of banks, and is accessed in a scatter-gather access mode, the access time as well as the power consumption can be reduced.

It is noted that the application may be exemplified by image processing and matrix operations.

BRIEF DESCRIPTION OF THE DRAWINGS

FIGS. 1A and 1B show a scatter-gather mode (x8 configuration) by a semiconductor memory device according to an exemplary embodiment.

PREFERRED MODES

Figure 2A:
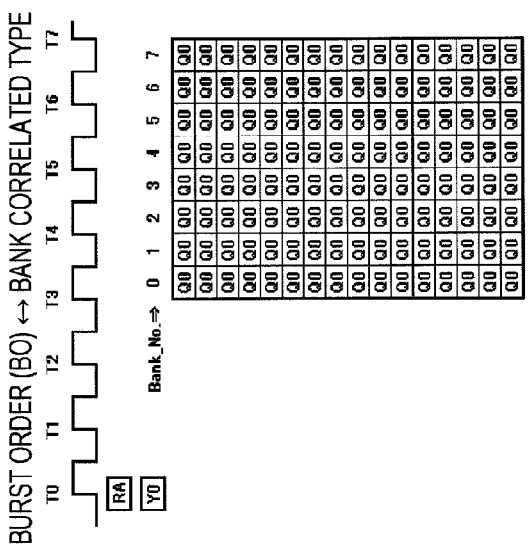
FIGS. 2A and 2B show scatter-gather mode (x16 configuration) by a semiconductor memory device according to an exemplary embodiment.

In the present disclosure, there are various possible modes, which include the following, but not restricted thereto. In a first mode, there is provided a semiconductor memory device according to the above mentioned first aspect. It is noted the reference to symbols shown in the Drawings are intended in the following disclosure of modes not restrictive to the illustrated manner in the Drawings, and are intended merely for helping better understanding of the inventive concept.

Figure 10:
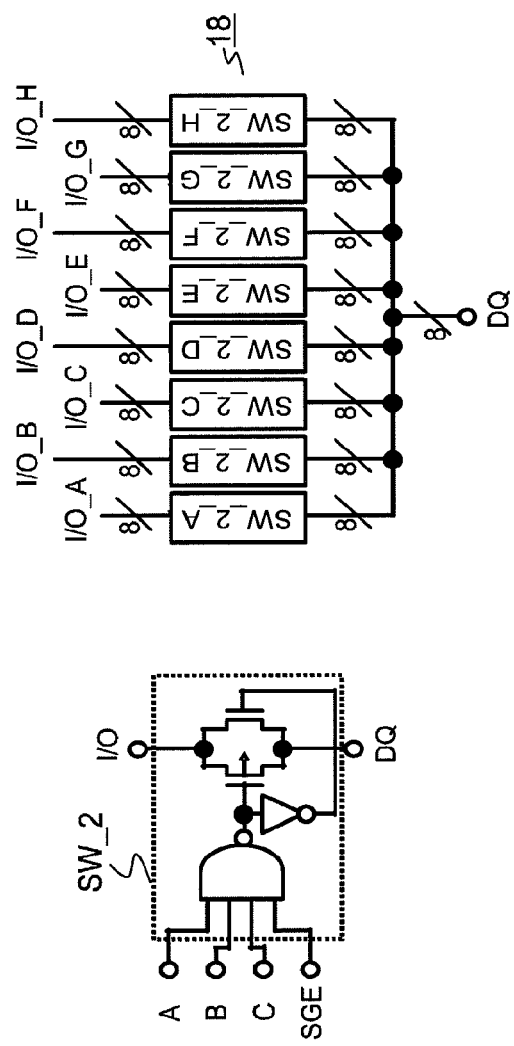
FIG. 10 is a circuit diagram showing the configuration of a scatter-gather circuit of the type in which the banks are associated with DQs.

Referring to FIG. 10, in a second mode, each of the multiple banks may include a plurality of blocks as defined by first addresses (YA0 to YA2) that differ from one another, and a plurality of inner block data terminals (I/O_A to I/O_H) associated with the multiple blocks. The above mentioned selector includes a plurality of first switches or switch elements (SW_2_A to SW_2_H). These first switches or switch elements may be coordinated to different switching logics by the above mentioned first addresses in each of the above mentioned multiple banks to provide for electrical connection between the above mentioned multiple data input/output pins and the multiple inner block data terminals (I/O_A to I/O_H).

Referring to FIG. 10, in a third mode, each of the multiple blocks in the third mode may include a plurality of memory cells. The multiple inner block data terminals (I/O_A to I/O_H) are a plurality of inner block data terminals (eight terminals I/O_A to I/O_H) that input/output data correlated with the multiple memory cells as selected by second addresses (YA_3 to YA_10) that are reciprocally the same addresses. The multiple first switches or switch elements (SW_2_A to SW_2_H) may be a plurality of first sub-switches (eight sub-switches SW_2). These first sub-switches are coordinated to the same switching logic by relevant ones of the first addresses (YA0 to YA2) to the same switching logic to provide for electrical connection between relevant ones of the multiple data input/output pins and the multiple inner data terminals (eight terminals I/O_A to I/O_H).

Referring further to FIG. 10, in a fourth exemplary embodiment, the multiple data input/output pins may include a plurality of serializers or a plurality of deserializers. The multiple first switches or switch elements (SW_2_A to SW_2_H) may provide for electrical connection between the input nodes of the serializers or the output nodes of the deserializers, contained in relevant ones of the data input/output pins, and the multiple inner data terminals (I/O_A to I/O_H).

In a fifth mode, if the number of the data input/output pins is equal to that of the banks, the selector may coordinate the multiple data input/output pins with the multiple banks in a one-for-one relationship. In a sixth mode, if the number of the data input/output pins is N times as large as that of the banks, where N>2, the selector may coordinate the multiple data input/output pins with the multiple banks in a N:1 relationship.

In a seventh mode, there is provided a semiconductor memory device according to the second aspect of the present invention.

Figure 11:
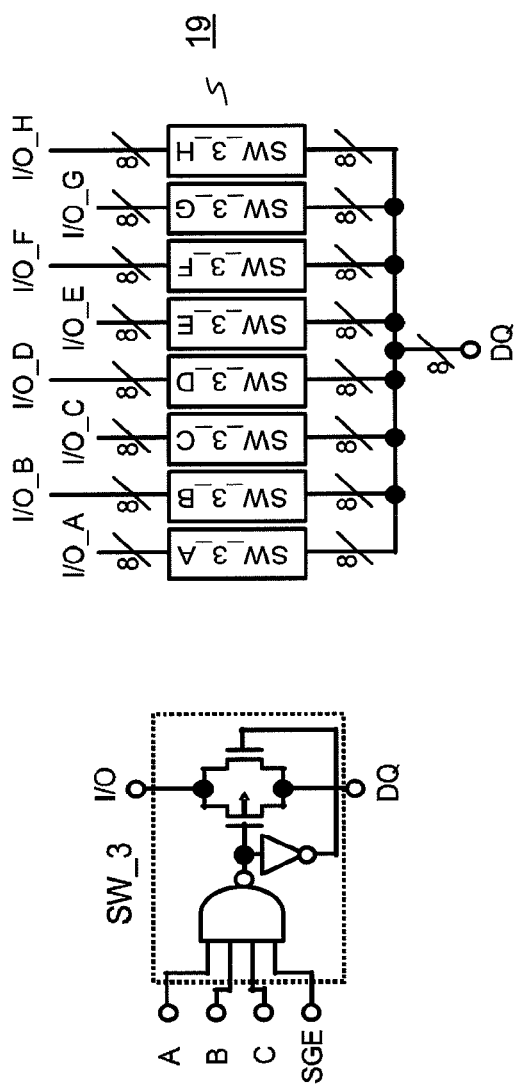
FIG. 11 is a circuit diagram showing the configuration of a scatter-gather circuit of the type in which the banks are associated with burst orders.

Referring to FIG. 11, in an eighth mode, the multiple banks may each include a plurality of blocks defined by the first addresses (YA0 to YA2) differing from one another. The multiple banks may also each include a plurality of inner block data terminals (I/O_A to I/O_H) associated with the multiple blocks. The selector may include, in each of the multiple banks, a plurality of second switches or switch elements (SW_3_A to SW_3_H). These second switches or switch elements are coordinated by the first addresses (YA0 to YA2) with switching logics different from one another to provide for electrical connection between the multiple data input/output pins and the multiple inner block data terminals (I/O_A to I/O_H).

Also, referring to FIG. 11, in a ninth mode, the above mentioned multiple blocks each include a plurality of memory cells. The inner block data terminals (I/O_A to I/O_H) may be a plurality of inner data terminals (eight terminals I/O_A to I/O_H). These inner data terminals input/output data relevant to multiple memory cells as selected by the second addresses (YA_3 to YA_10) that are reciprocally the same addresses. The multiple second switches or switch elements (SW_3_A to SW_3_H) may be a plurality of second sub-switches (eight switches or switch elements SW_3). These second sub-switches are correlated with the same switching logic by relevant first addresses (YA0 to YA2) to provide for electrical connection between the total of the multiple data input/output pins and a plurality of inner data terminals (eight terminals I/O_A to I/O_H).

Further, referring to FIG. 11, in a tenth mode, the multiple data input/output pins each include a serializer or a deserializer. The multiple second switch elements (SW_3_A to SW_3_H) may each provide for electrical connection between an input node of the serializer or an output node of the deserializer and a relevant one of the multiple inner data terminals. Each serializer or deserializer is contained in a relevant one of the multiple data input/output pins.

In an eleventh mode, in case the burst length in the above mentioned burst mode is equal to the number of the banks, the above mentioned selector may coordinate the individual information data in the access order and the above mentioned multiple banks in a one-for-one relationship.

In a twelfth mode, there is provided a semiconductor memory device in which the same column address is specified for the above mentioned multiple banks at the time of reading out from or writing in these banks. In a thirteenth mode, there is provided a semiconductor memory device in which first addresses that are reciprocally the same addresses are specified for the above mentioned multiple banks at the time of reading out from or writing in these banks. In a fourteenth mode, second addresses that are reciprocally the same addresses may be specified for the above mentioned multiple banks at the time of reading out from or writing in these banks.

In a fifteenth mode, the above mentioned control circuit may selectively activate the above mentioned multiple banks, by way of a third access mode, in response not only to a single read-out or write-in command from outside but also to third addresses (bank addresses). The selector may coordinate the above mentioned multiple data input/output pins with the selectively activated banks by way of the above mentioned third access mode.

Figure 9:
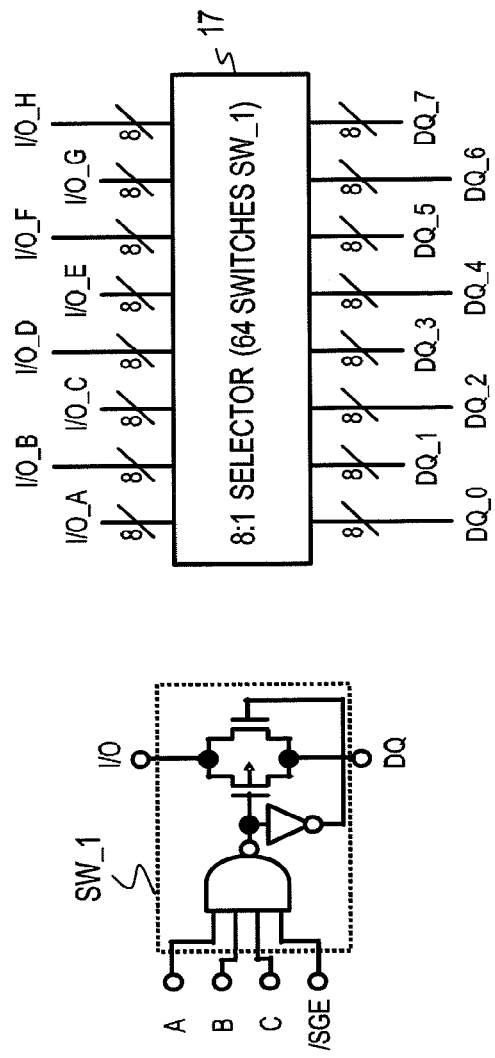
FIG. 9 is a circuit diagram showing the configuration of the 8:1 selector.

Referring to FIG. 9, in a sixteenth mode, the above mentioned selector may include a plurality of third switches or switch elements (8:1 selector 17). These third switches or switch elements (8:1 selector 17) are coordinated by the above mentioned third addresses (bank addresses) to switching logics different from one another to provide for electrical connection between the above mentioned multiple data input/output pins and a plurality of inner block data terminals (I/O_A to I/O_H).

In a seventeenth mode, the above mentioned control circuit may switch between the above mentioned first access mode and the above mentioned third access mode depending on a mode selection signal. In an eighteenth mode, the mode selection signal may be supplied from outside along with the above mentioned read-out or write-in command.

In a nineteenth mode, the above mentioned control circuit may selectively activate the above mentioned multiple banks, by way of a third access mode, in response not only to a single read-out or write-in command from outside but also to a third address (bank address). The selector may coordinate the above mentioned multiple data input/output pins with the selectively activated banks by way of the above mentioned third access mode.

Referring to FIG. 9, in a twentieth mode, the above mentioned selector may include a plurality of third switches or switch elements (8:1 selector 17) in each of the multiple banks. The multiple third switches or switch elements (8:1 selector 17) are coordinated by the above mentioned third addresses (bank addresses) with switching logics different from one another to provide for electrical connection between the above mentioned multiple data input/output pins and the above mentioned multiple inner block data terminals.

In a twenty-first mode, the above mentioned control circuit may switch between the above mentioned second and third access modes by a mode selection signal. In a twenty-second mode, the mode selection signal may be supplied from outside along with the read-out command or the write-in command.

A semiconductor memory device according to an exemplary embodiment will now be described with reference to the drawings. FIGS. 1A and 1B show an operation of the semiconductor memory device according to the present exemplary embodiment. In more detail, FIGS. 1A and 1B show operating waveforms of the scatter-gather access. An upper part of FIGS. 1A and 1B show a read-out operation and a lower part of FIGS. 1A and 1B show a write-in operation. FIG. 1A shows an access system in which the banks and DQs are associated with each other in accessing. On the other hand, FIG. 1B shows an access system in which the banks and the burst order (BO) are associated with each other in accessing.

Commands (CMDs) RA and WA denote, respectively, a scatter-gather mode read-out command and a scatter-gather mode write-in command. An address (ADD) Y0 stands for a column address 0. This column address (address 0) corresponds to the column address 0 of an opened page of each bank. Viz., the scatter-gather mode access of the present exemplary embodiment specifies the same column addresses of the opened pages of the respective banks in executing read-out/write-in operations.

The case shown in FIGS. 1A and 1B is of a x8 bit configuration, with the burst length being 8. Thus, an array of data of a data size of 8×8 may be accessed by a single read-out/write-in operation. Here, the number of banks is set to 8, as an example. In FIG. 1A, each bank is associated with a sole DQ and, in FIG. 1B, each bank is associated with a sole burst order (BO).

Figure 2B:
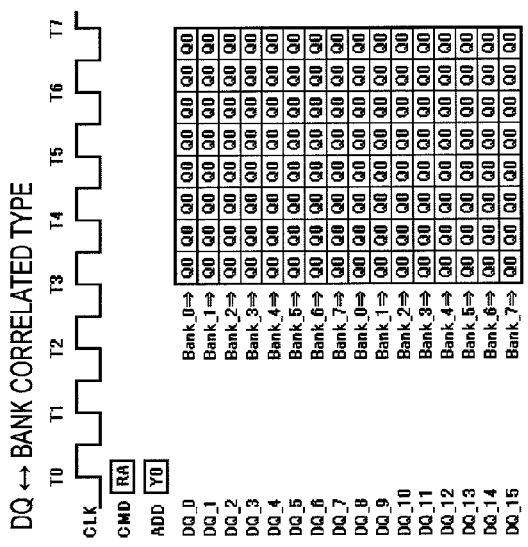

The number of the banks may be set so as to be smaller than the number of the DQs as shown in FIGS. 2A and 2B. Conversely, the number of the banks may be set so as to be larger than the number of the DQs, in a manner not shown. In case the number of the banks is larger than that of the DQs, it is sufficient that the function of specifying a bank in entering a command and an address is additionally provided in the arrangements of FIGS. 1A and 2A. If conversely the number of the banks is smaller than that of the DQs, it is sufficient that a plurality of DQs is associated with a single bank.

The number of the banks may be larger or smaller than the burst length, in a manner not shown. If the number of the banks is larger than the burst length, it is sufficient that the function of specifying a bank in entering a command and an address is additionally provided in the arrangements of FIGS. 1B and 2B. If conversely the number of the banks is lesser than that of the DQs, it is sufficient that a single bank is associated with a plurality of burst orders (BO).

In the present description, the memory is of the x8 bit configuration and the burst length is 8, only for ease in understanding the explanation. This configuration may readily be modified to any other desired configuration.

Figure 3:
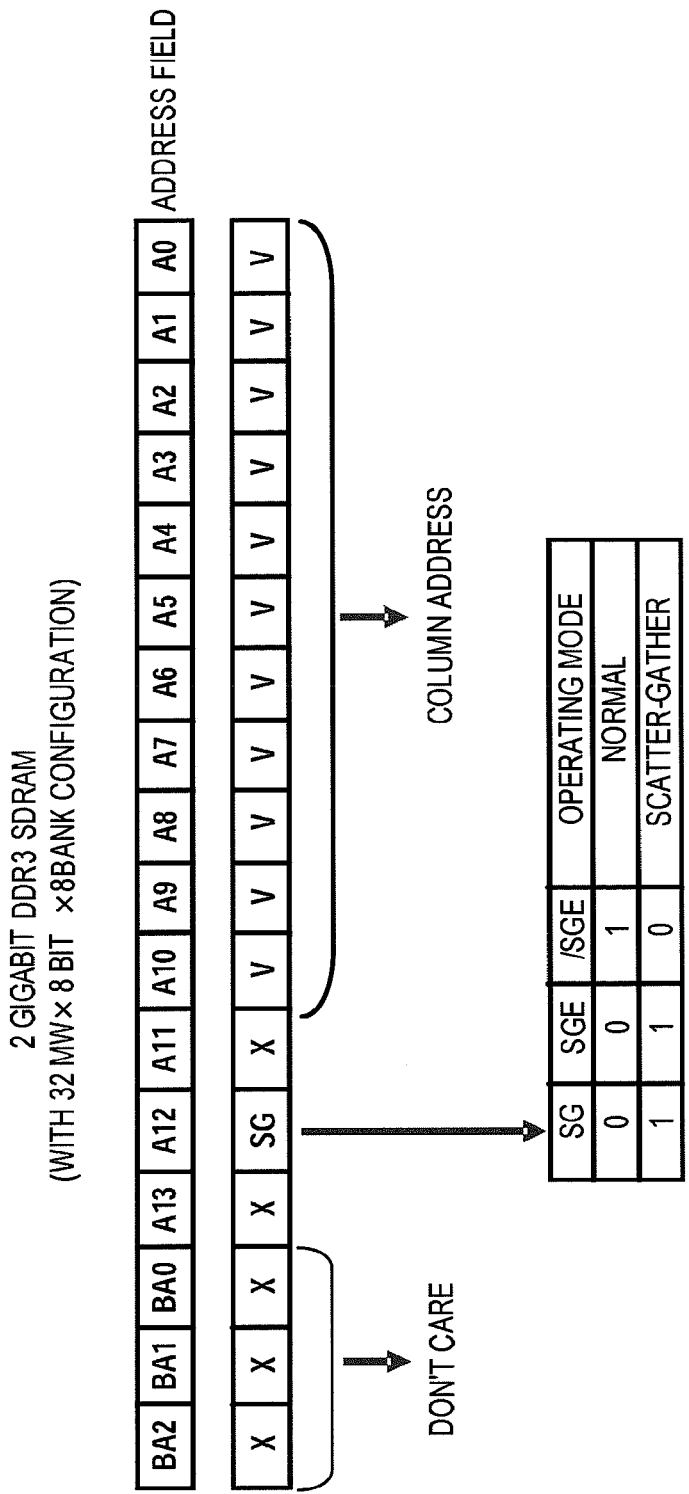
FIG. 3 shows an example method for setting a scatter-gather command.

FIG. 3 shows a method of setting the scatter-gather command only by way of an example. On receipt of a read-out command or a write-in command, an address pin A12 is set to HIGH (1) to render the scatter-gather mode valid.

In the scatter-gather mode, a scatter-gather mode controlling internal signal SGE is set to HIGH, whilst a signal /SGE is set to LOW. On the other hand, if the address pin A12 is set in the normal mode to LOW (0), the signal SGE is set to LOW, whilst the signal /SCE is set to HIGH. A column address is entered from address pins A0 to A10.

In the present exemplary embodiment, the configuration is of the x8 bit width, with the burst length being 8 and the number of banks also being 8. Usually, the total of the eight banks are accessed, so that the bank addresses are DON'T CARE. However, if the number of the banks is 16, for example, as described above, these may be split into two groups, each of which is made up of eight banks. A signal for selecting one of the groups may then be entered. It is also possible to split eight banks into two groups, each made up of four banks, and to deliver a signal for selecting one of the groups as input signal.

Figure 4:
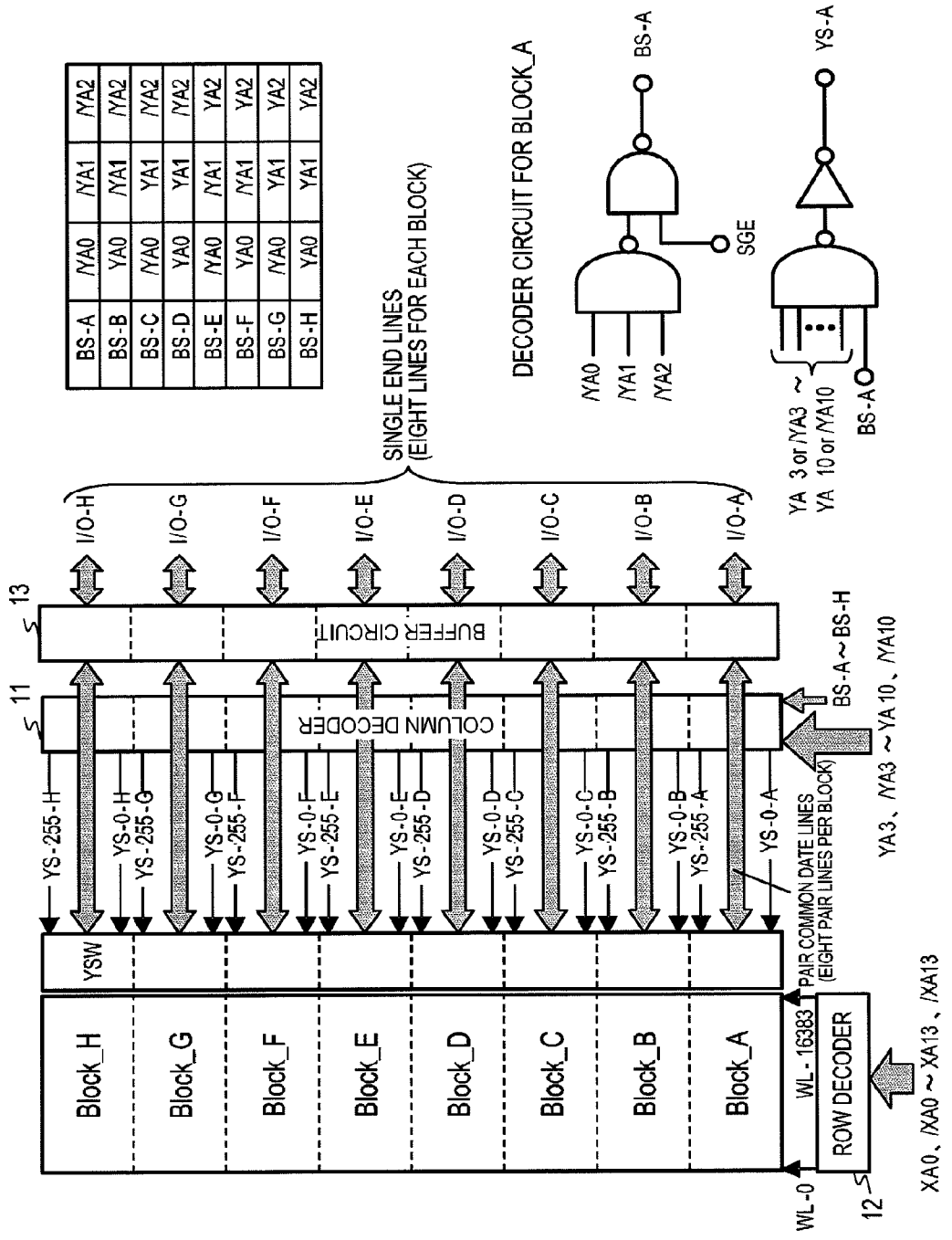
FIG. 4 shows an example configuration of a 256 Mb memory bank and a column decoder circuit.

FIG. 4 shows an example of a 256 Mb memory bank configuration and a column decoder circuit. A memory cell array is split into eight blocks of Block_A to Block_H, for each of which 8-bit data are read or written simultaneously. Block selection signals BS_A to BS_H are selected by column addresses YA0 to YA2.

In the normal mode, the scatter-gather mode controlling internal signal SGE is set to LOW, so that each one column selection signal YS is simultaneously selected for each block so as to allow accessing the total of 64 bit data. On the other hand, in the scatter-gather mode, the signal SGE is set to HIGH. Thus, a sole YS line of a single block, as selected by the addresses YA0 to YA2, is activated. Hence, no unneeded blocks are in operation, thus saving power consumption.

Figure 5:
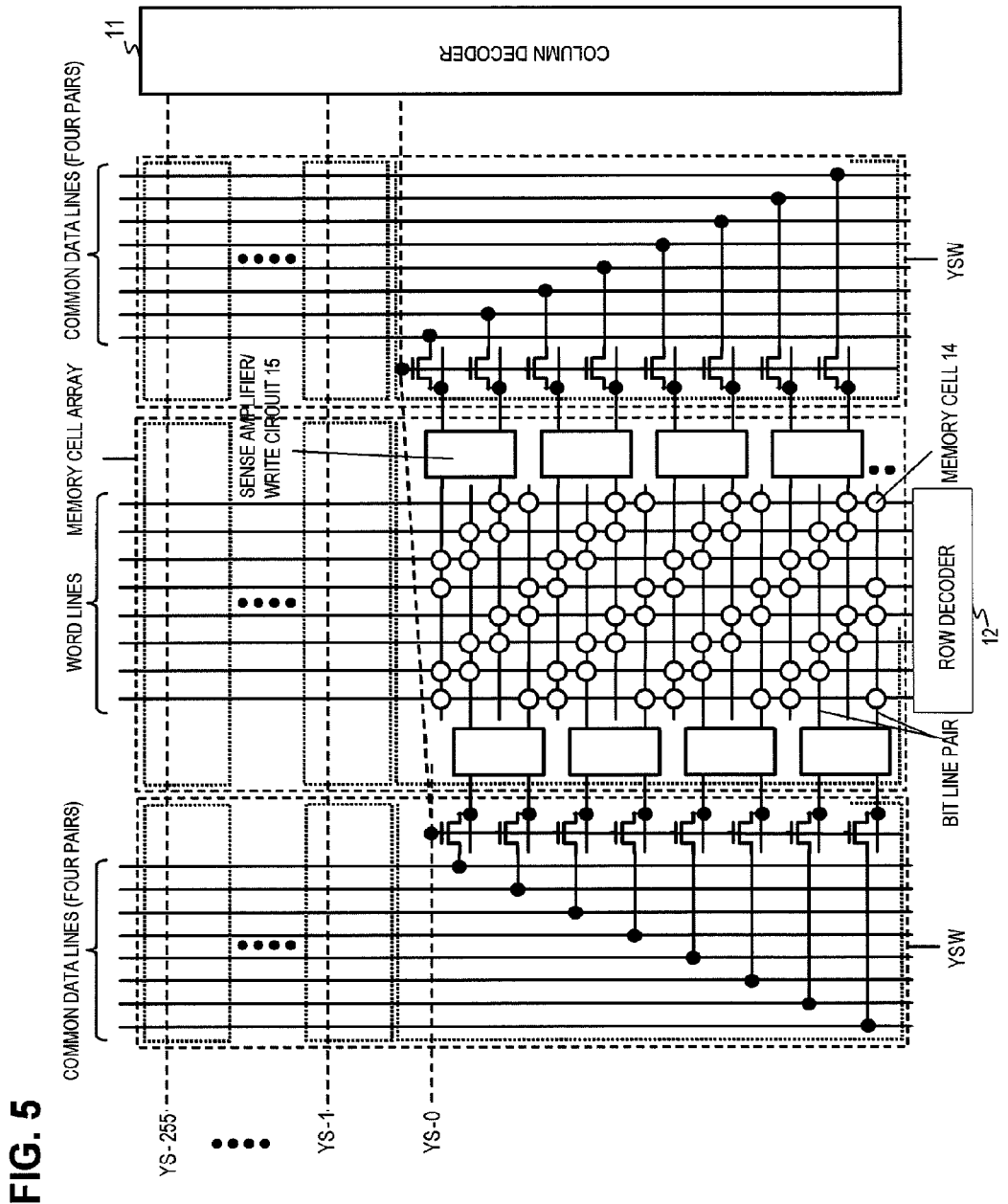
FIG. 5 shows an example configuration of a 256 Mb memory bank.

The above mentioned blocks are accessed by eight sets, each composed of a common data line pair, via column switches YSW. These column switches selectively connect the common data line pairs to the sense amplifier/write circuits 15. The sense amplifier/write circuits 15, which will be described with reference to FIG. 5, are selected by the column selection lines YS. The common data line pairs are buffered by a buffering circuit 13 and exchange data with the outside via I/O lines I/O_A to I/O_H (single-ended signal lines). It should be noted however that this is merely illustrative and is not intended to limit the present invention.

FIG. 5 shows a concrete example arrangement of the 256 Mb memory bank shown in FIG. 4. Referring to FIG. 5, pair common bit lines are connected to the sense amplifier/write circuits 15. A memory cell 14 is connected to one of points of intersection of each pair common bit line with a word line. One of the column selection line YS, herein YS_0, is connected to the gates of eight column switch MOS transistors of each of two sets, and selectively connects the common data line pair to the sense amplifier/write circuits 15 selected by the line YS as described above.

Figure 6:
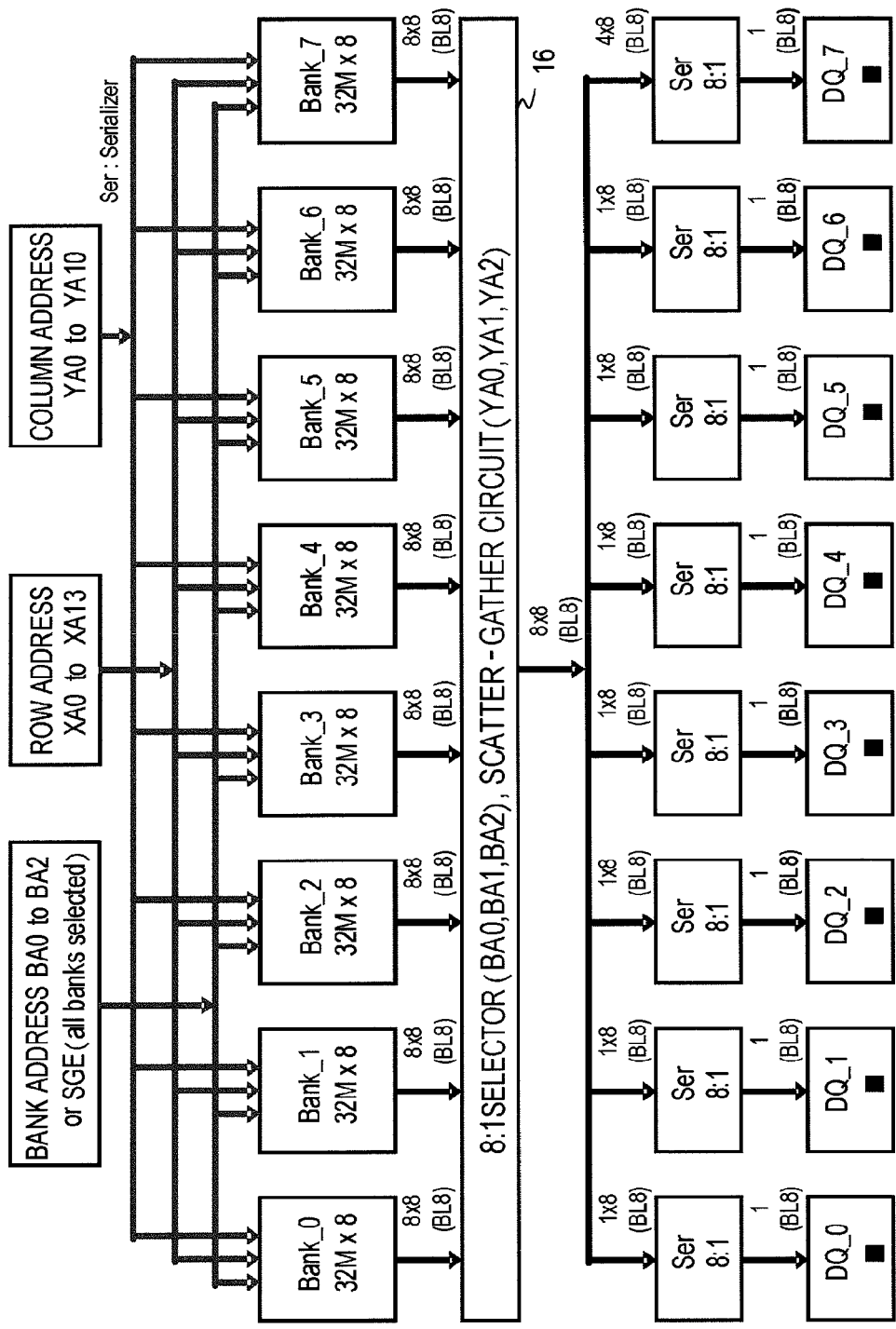
FIG. 6 shows flow of read-out data in a semiconductor memory device according to an exemplary embodiment.

FIG. 6 shows flow of data in the semiconductor memory device of the present exemplary embodiment during its read-out operation. During the normal mode, 64 bit data read out from the selected bank are processed with selection by an 8:1 selector with the aid of bank addresses BA0 to BA2. The so selected data are parallel-to-serial converted by a set of serializers Ser associated with eight DQ pins so as to be output in a burst mode.

In the scatter-gather mode, eight bits are read out from each of the eight banks, using the column addresses YA0 to YA2. 64 bit data are gathered and distributed to the eight DQ pins. The resulting data are parallel-to-serial converted by the associated serializers Ser so as to be output in a burst mode.

Figure 7:
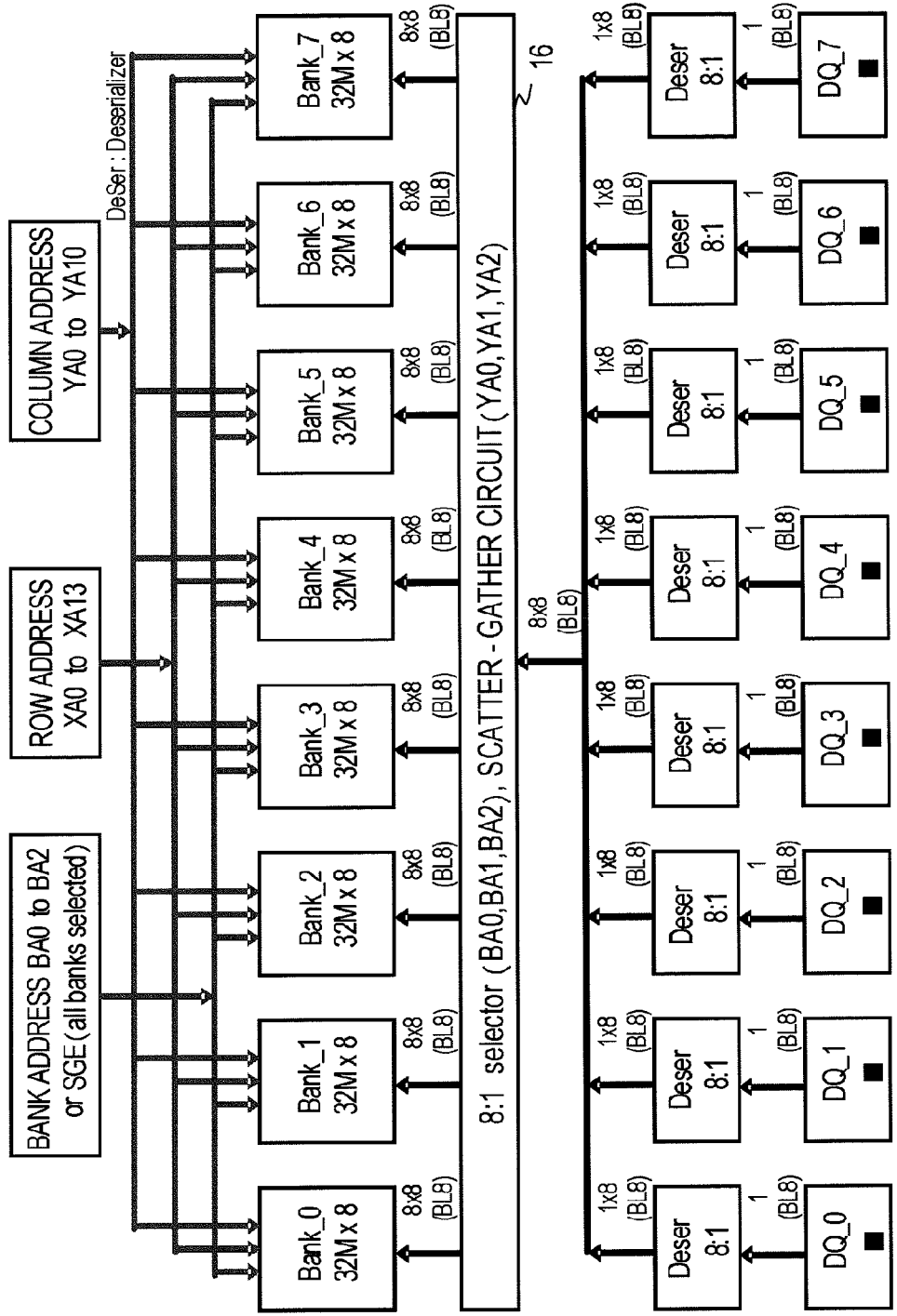
FIG. 7 shows flow of write-in data in a semiconductor memory device according to an exemplary embodiment.

FIG. 7 shows flow of data during write by the semiconductor memory device of the present exemplary embodiment. During the normal mode, the 8-bit data, entered in the burst mode from the eight DQ pins, are serial-to-parallel converted by associated deserializers DeSer. 64-bit data are collected together and sent to an 8:1 selector 16 so as to be written in the bank selected by the bank address.

During the scatter-gather mode, the 8-bit data, entered in the burst mode from the eight DQ pins, are serial-to-parallel converted by associated deserializers DeSer. 64-bit data are collected together and sent to a scatter-gather circuit 16 so as to be split into a plurality of sets, each of 8-bit data, associated with the eight banks. The sets each of the 8-bit data are written in selected blocks of the eight banks, using the column addresses YA0 to YA2.

Figure 8:
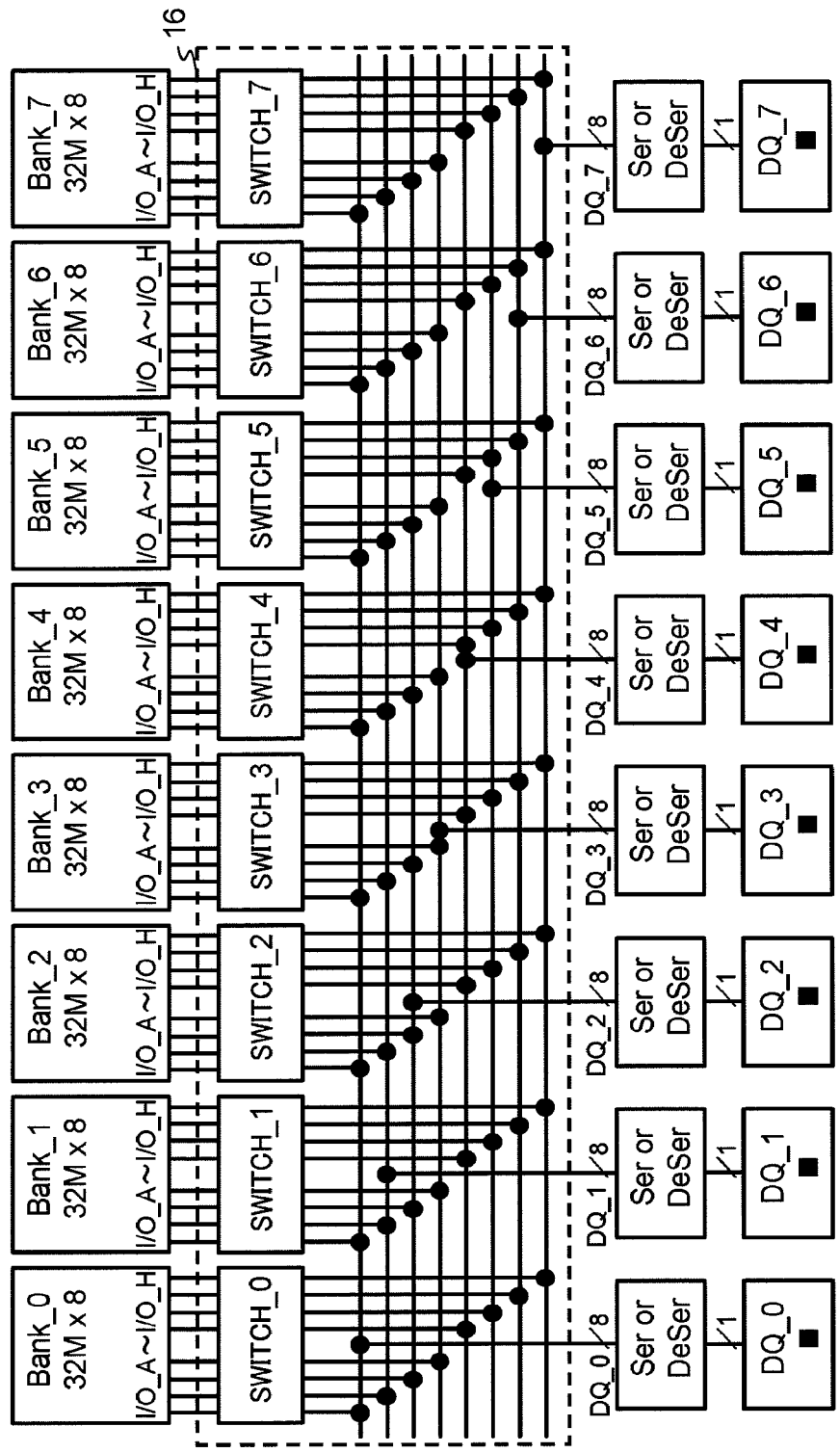
FIG. 8 is a block diagram showing the configuration of an 8:1 selector and a scatter-gather circuit.

FIG. 8 depicts a block diagram of the scatter-gather circuit 16 shown in FIGS. 6 and 7. 8-bit data lines DQ_0 to DQ_7, associated with the DQs, are connected to the total of eight switches (switch_0 to switch_7) provided in association with the banks. Eight sets of I/O lines of eight bits each (IO_A to I/O_H) from the banks are connected to the eight switches associated with the banks.

FIG. 9 depicts a circuit diagram of an 8:1 selector 17 arranged in each of the eight switches (switch_0 to switch_7) shown in FIG. 8. The I/O lines IO_A to I/O_H and the data lines DQ_0 to DQ_7 are interconnected and controlled by 64 switches or switch elements SW_1.

During the normal mode, the signal/SGE is set to HIGH. Thus, the 8:1 selector 17 in the single switch, selected from among the eight switches (switch_0 to switch_7) by the bank addresses BA0 to BA2, entered to the switches or switch elements SW_1, is turned on. During the scatter-gather mode, the signal/SGE is set to LOW. Hence, in the total of the switches (switch_0 to switch_7), the 8:1 selectors 17 are turned off.

Figure 15:
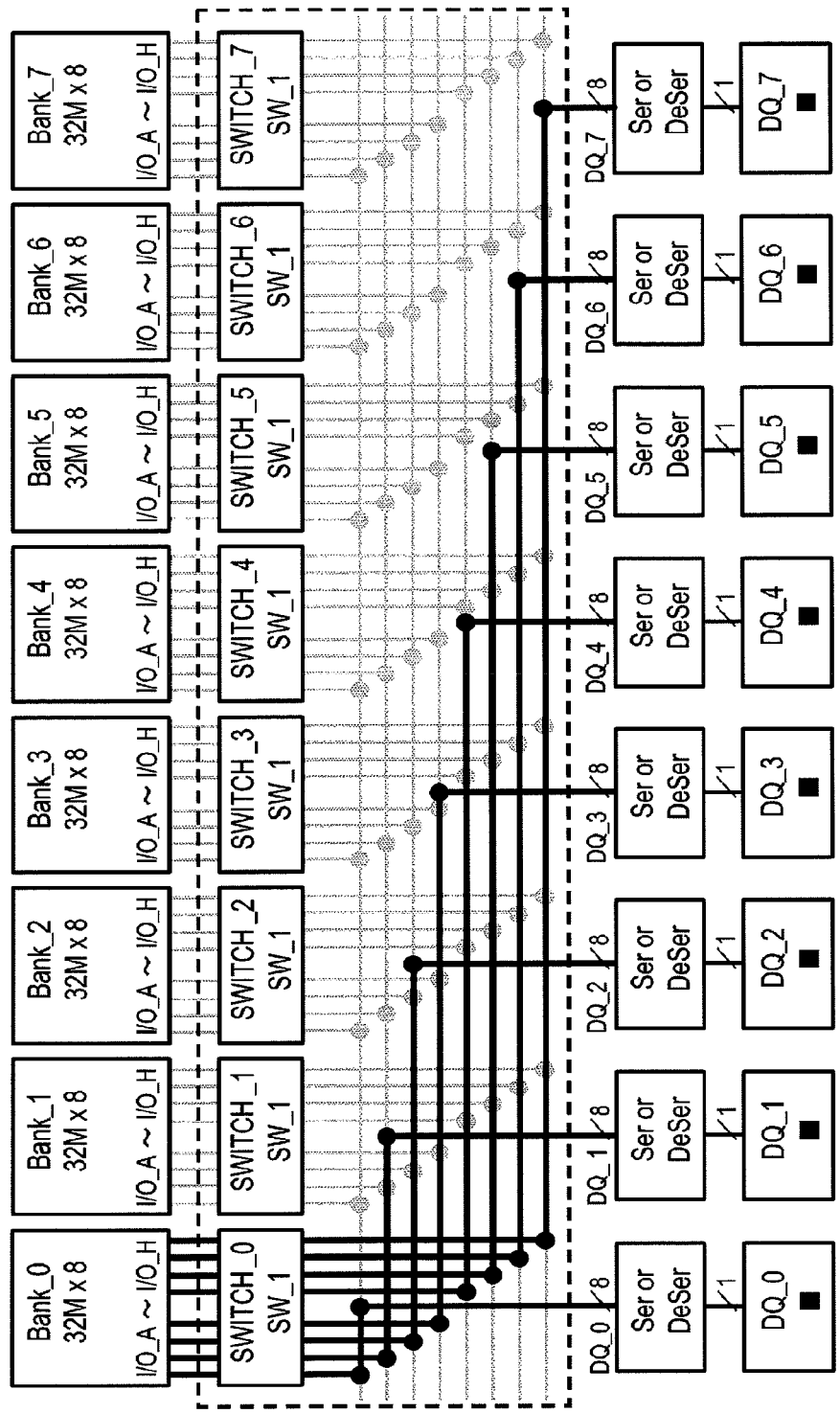
FIG. 15 shows example data paths during the normal mode.

FIG. 15 depicts data paths in case the bank Bank_0 is accessed during the normal mode. At this time, the bank addresses are such that BA0=BA1=BA2=0, such that, in FIG. 9, only the 8:1 selector in the switch_0, in which the input signals A to C of the switch element SW_1 are all '1', is turned on. Hence, eight 8-bit data, associated with DQ_0 to DQ_7, thus totaling at 64 bits of data, are coupled to eight I/O lines (IO_A to I/O_H) of the bank Bank_0 via switch_0. It should be noted that thick solid lines in FIG. 15 each represent an eight bit wide data path.

FIG. 10 shows a configuration of a scatter-gather circuit 18 arranged in each of the eight switches (switch_0 to switch_7) shown in FIG. 8. The scatter-gather circuit 18 is of the type in which the banks are associated with the DQs. The data lines DQ_0 to DQ_7, associated with eight DQ pins, are connected to the switches (switch_0 to switch_7).

In the scatter-gather mode, the signal SGE is set to HIGH. An 8-bit data line DQ is thus coupled, via a switch element SW_2, to a set of the I/O lines. This I/O line set is among the eight sets of the I/O lines (IO_A to I/O_H) of a relevant one of the banks, and has been selected by the column addresses YA0 to YA2. During the normal mode, the signal SGE is set to LOW, so that the scatter-gather circuit 18 in each of the total of the switches (switch_0 to switch_7) is turned off.

Figure 16:
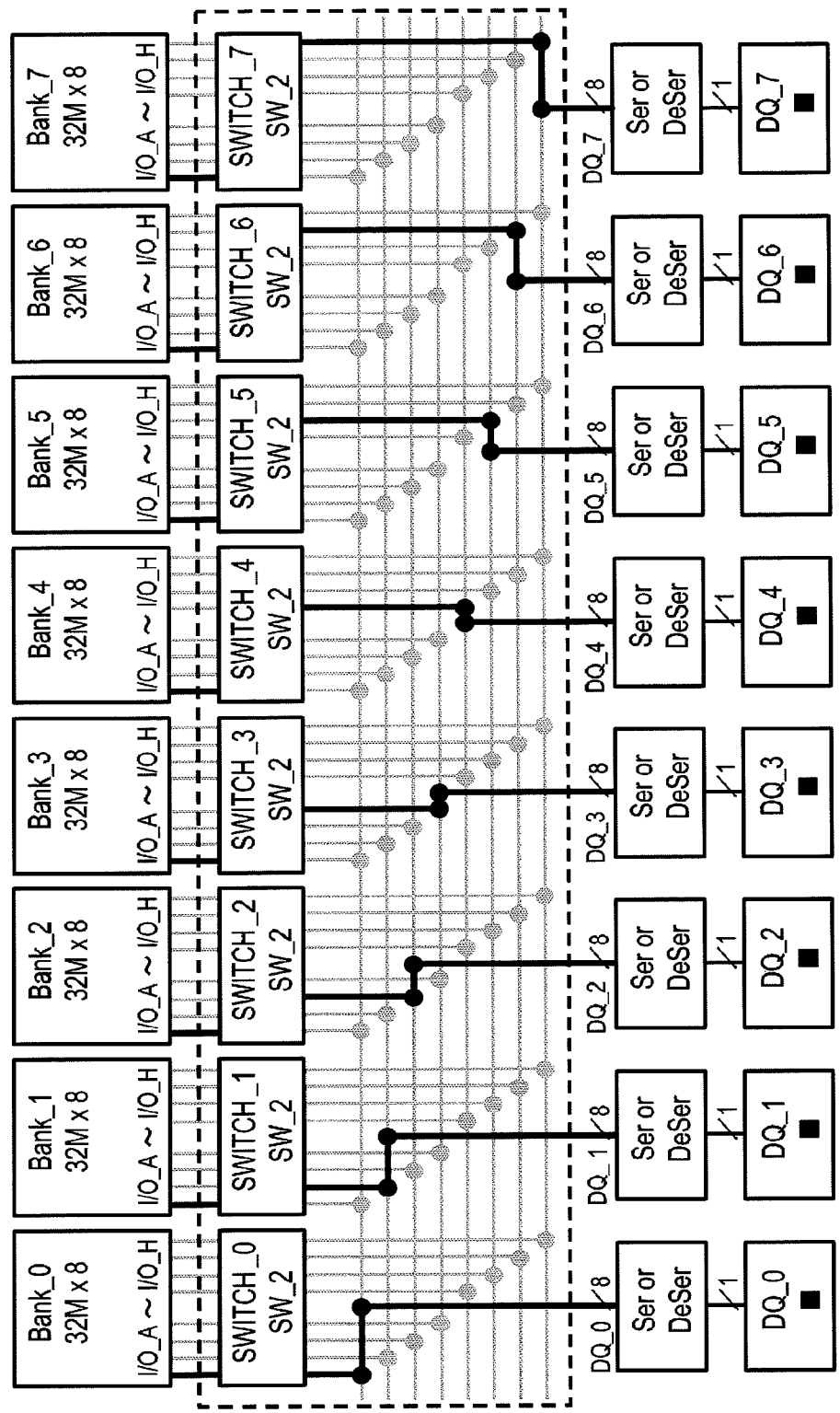
FIG. 16 shows example data paths during the scatter-gather mode in which the banks are associated with DQs.

FIG. 16 shows data paths in a case where, in the scatter-gather mode in which the banks are associated with the DQs, the I/O lines IO_A of the total of the banks have been selected. In this case, the column addresses become Ya0=YA1=YA2=0, such that, in the switches (switch_0 to switch_7) of FIG. 10, only the switch element SW_2_A, in which the input signals A to C in SW_2 are all '1', is turned on. Thus, the eight 8-bit data, each associated with DQ_0 to DQ_7, are coupled to the sets of the I/O lines I/O_A of the banks Bank_0 to Bank_7 via the switches (switch_0 to switch_7). Meanwhile, the thick solid lines in FIG. 16 each stand for an 8-bit wide data path.

FIG. 11 shows a configuration of a scatter-gather circuit 19 in which the banks are associated with the burst order (BO). This scatter-gather circuit 19 is arranged in each of the eight switches (switch_0 to switch_7) shown in FIG. 8. Out of the data lines DQ_0 to DQ_7, associated with the eight DQ pins, the DQ signal lines that are in keeping with the burst order are connected to the switches (switch_0 to switch_7) in the burst order.

In the scatter-gather mode, the signal SGE is set to HIGH. Thus, the 8-bit data lines DQ, which are in keeping with the burst order, are connected to I/O lines via switch elements SW_3. These I/O lines are among the eight I/O lines (IO_A to I/O_H) of relevant ones of the banks and have been selected by the column addresses YA0 to YA2. On the other hand, during the normal mode, the signal SGE is set to LOW. Thus, in each of the total of the switches (switch _0 to switch _7), the scatter-gather circuit 19 is turned off.

Figure 17:
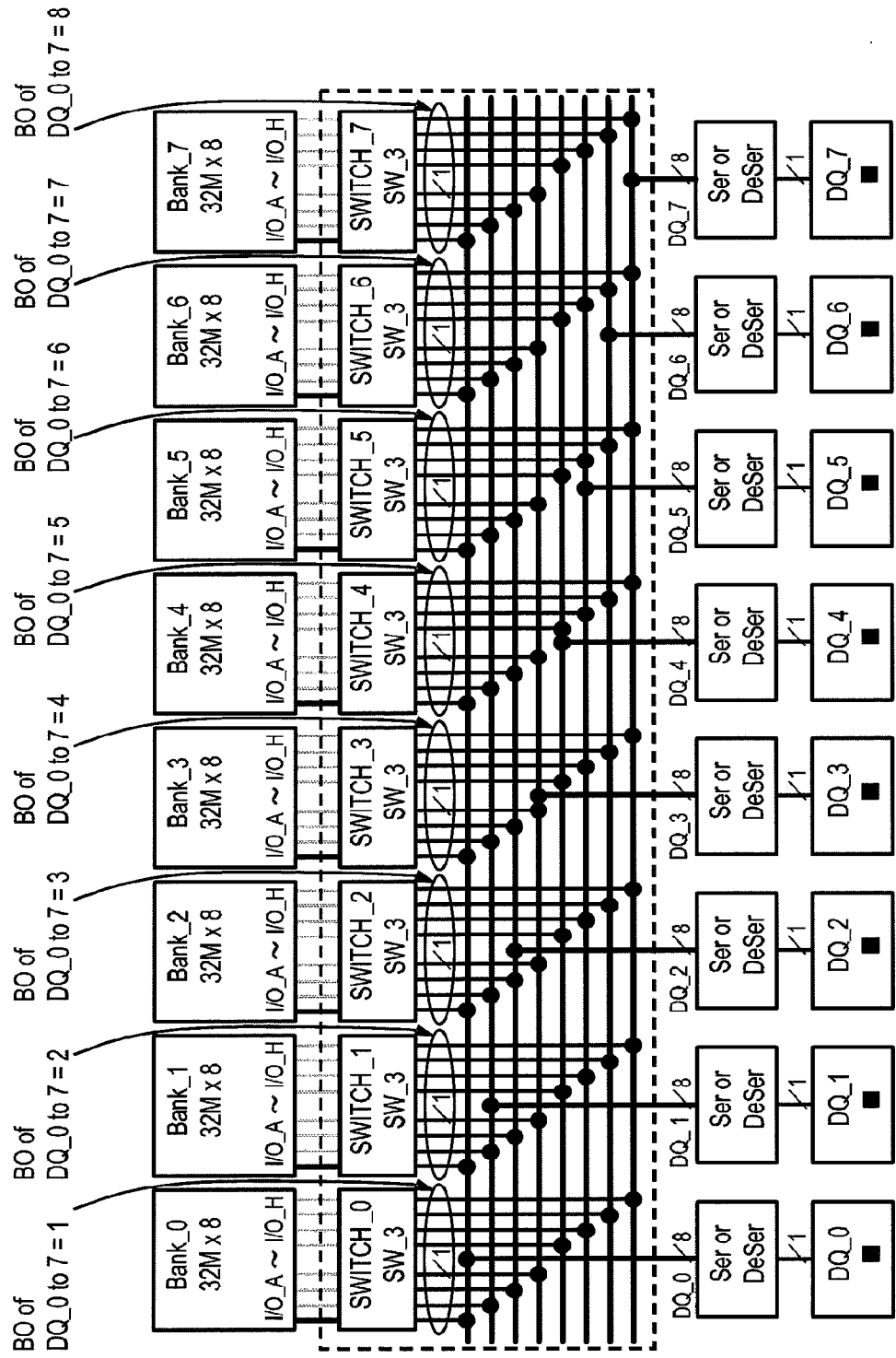
FIG. 17 shows example data paths during the scatter-gather mode in which the banks are associated with burst orders.

FIG. 17 shows data paths in a case where, in the scatter-gather mode in which the banks are associated with the burst order (BO), the I/O lines IO _A of the total of the banks have been selected. In this case, the column addresses are such that YA0=YA1=YA2=0. Out of the switches (switch _0 to switch _7) in FIG. 11, only the switch or switch element SW_3_A, in which the input signals A to C of SW_3 are all '1', is turned on. Hence, eight 8-bit data of DQ_0 to DQ_7, associated with the burst order BO=1 up to the burst order BO=8, are coupled to one set of the I/O lines I/O_A of the banks Bank_0 to Bank_7. In FIG. 17, thick solid lines stand for eight bit wide data paths, while thin lines stand for one bit wide data paths.

Figure 12:
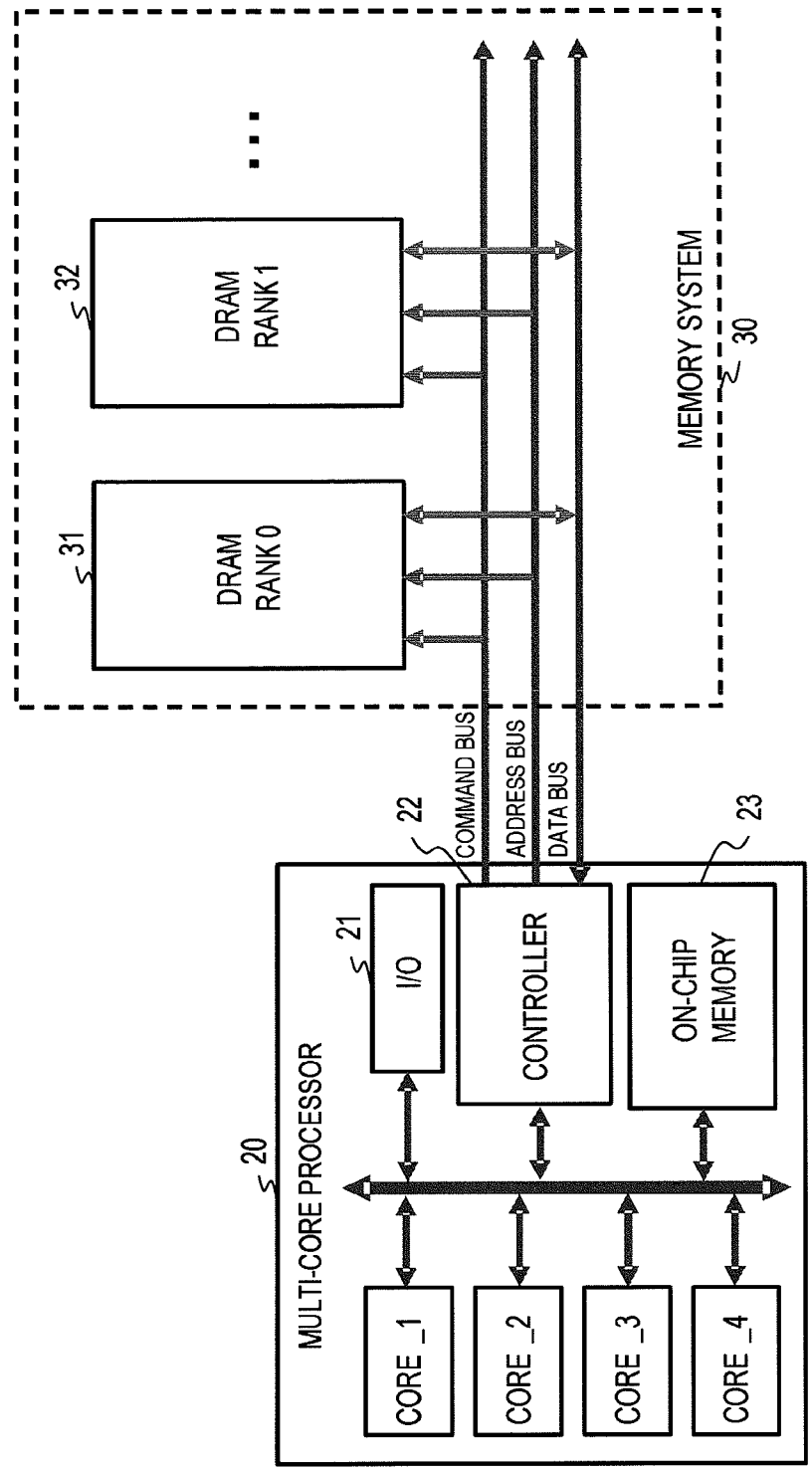
FIG. 12 shows an example configuration of a computer including, as a DRAM, the semiconductor memory device of the exemplary embodiment.
Figure 13A:
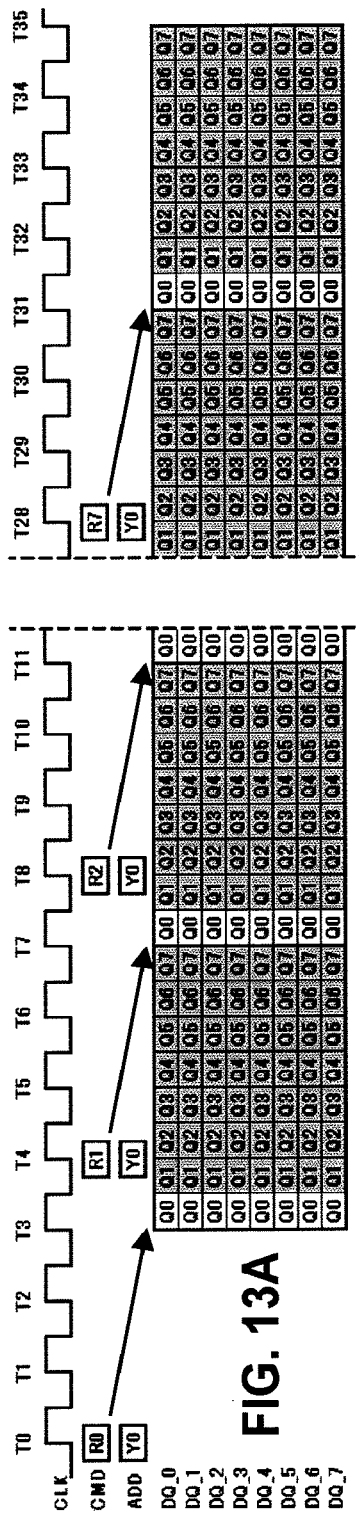
FIGS. 13A, 13B and 13C show read-out operations of a conventional bank interleaved configuration.
Figure 13B:
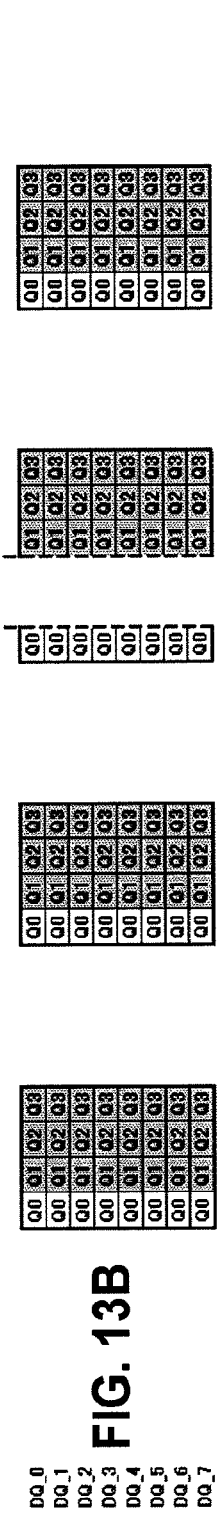
Figure 13C:
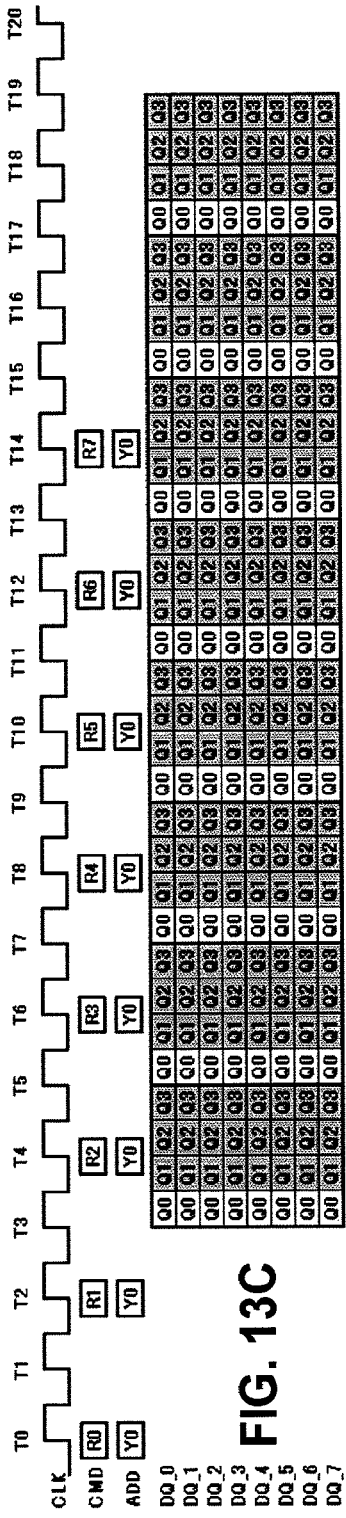
Figure 14A:
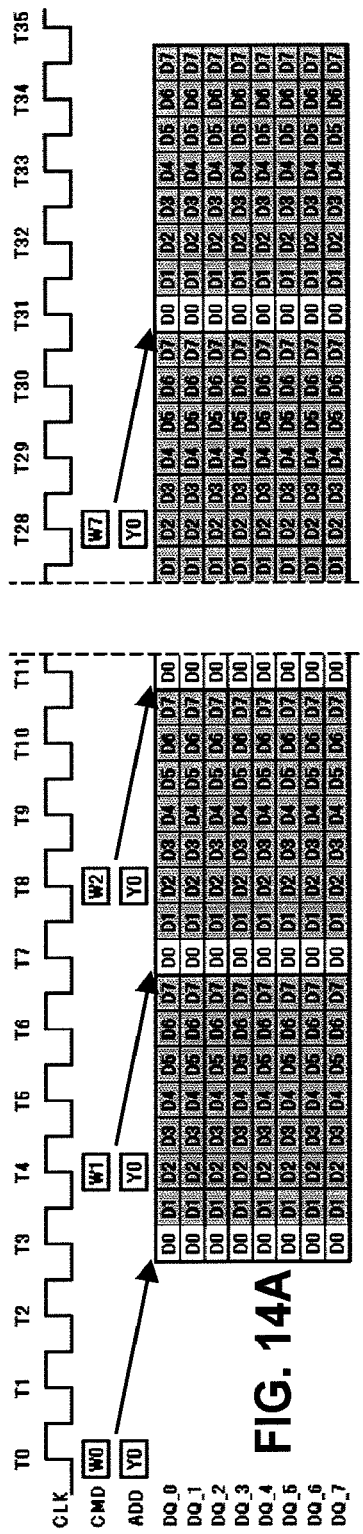
FIGS. 14A, 14B and 14C show write-in operations of the conventional bank interleaved configuration.
Figure 14B:
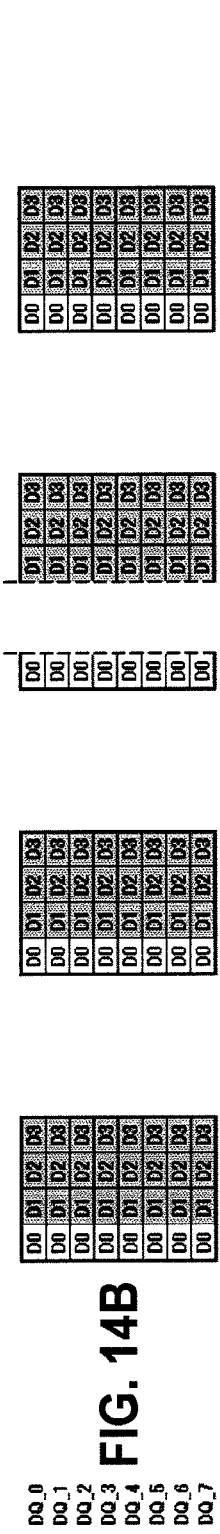
Figure 14C:
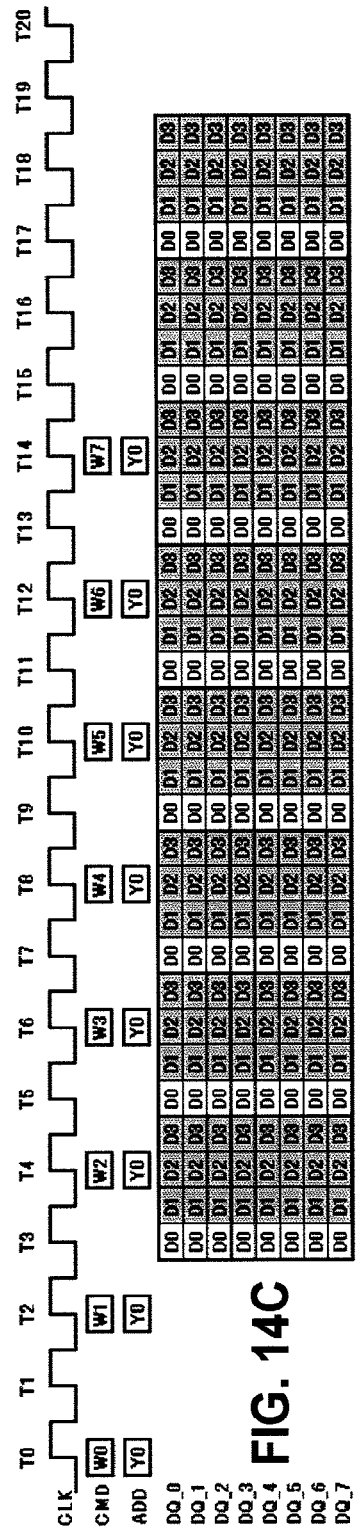

FIG. 12 shows an example configuration of a computer including a semiconductor memory device according to the present exemplary embodiment as each of DRAMs 31 and 32. Referring to FIG. 12, a multi-core processor 20 and a memory system 30 are interconnected by a command bus, an address bus and a data bus. In case CPU cores (core _1 to _4) perform image processing or processing on matrices in parallel, access from the cores to the memory system 30 can be completed in a shorter time. Hence, the processing efficiency can be improved with decreased power consumption.

FIG. 12 shows an example configuration of an information data control system including information data memory devices (DRAMs) 31, 32 and a controller 22 that controls the operation of the information data memory devices 31, 32. The information data memory devices 31, 32 are each at least provided with a configuration disclosed in the above described exemplary embodiment. It should be noted that, although the memory system 30 of FIG. 12 includes two semiconductor memory devices 31, 32, it may also be provided with at least one semiconductor memory device without departing from the scope of the invention.

The controller 22 is connected to the semiconductor memory device via the command bus, address bus and the data bus. The controller 22 is also connected via other buses to a multi-core processor (core _1 to _4, an I/O 21 and an on-chip memory 23). The semiconductor memory device of the present exemplary embodiment may also be included in the controller 22 itself (see FIG. 12).

The information data processing system of FIG. 12 may, for example, be a system loaded on electronic equipment. Viz., the information data processing system may be loaded on, for example, a personal computer, electronic communication equipment, electronic equipment loaded on a mobile system, such as a car, other industrial electronic equipment, or on electronic equipment for civil use.

With the semiconductor memory device of the present exemplary embodiment, described above, it is possible to gather or collect data of the same column address in in-page data of a plurality of banks in the opened state to access the data with a single read-out or write-in operation. Assume that respective rows of a two-dimensional data array are placed distributed in pages of a plurality of banks in opened state and accessed by way of scatter-gather access for an application such as image processing or matrix operation. If the semiconductor memory device of the present exemplary embodiment is used for such case, the access time may be decreased with decrease in power consumption.

With the semiconductor memory device of the present exemplary embodiment, the above mentioned function and the normal operation may be interchanged on the fly whenever necessary. Hence, the optimum access mode which is in keeping with the configuration of an access request may be applied for all time. Hence, with the semiconductor memory device of the present exemplary embodiment, it is possible to improve the processing efficiency as the entire system as well as to decrease the power consumption.

Viz., with the semiconductor memory device of the present exemplary embodiment, switching may be made as necessary on the fly from the operation of the scatter-gather mode in which the banks are associated with DQs or/and that in which the banks are associated with the burst order (BO) to the normal operation or vice versa. It is thus possible to apply the access mode which is in keeping with the configuration of an access request for all time. The controller 22 includes a circuit configured for switching on the fly. It is thus possible with the semiconductor memory device to improve the overall processing efficiency of the system as well as to decrease the power consumption.

Only the operation of the scatter-gather mode in which the banks are associated with DQs may be sufficient. Moreover, only the operation of the scatter-gather mode in which the banks are associated with the burst order may be sufficient. In addition, the semiconductor memory device may include both the scatter-gather mode in which the banks are associated with DQs and the scatter-gather mode in which the banks are associated with the burst order.

The present invention is not limited to the synchronous DRAM as disclosed in the above described exemplary embodiment, and may be applied to a large variety of semiconductor memories or semiconductor memory devices. The present invention may also be applied to a large variety of sorts of the semiconductor memory devices provided with a plurality of data input/output pins, a plurality of banks for storage of different storage information data, selectors and control circuits as defined in the claims. Examples of these different sorts of the semiconductor memory devices include a CPU (Central Processing Unit), a MCU (Micro Control Unit), a DSP (Digital Signal Processor), an ASIC (Application Specific Integration Circuit) and an ASSP (Application Specific Standard Product). The present invention may further be applied to products having diversified package configurations, such as SOC (System on Chip), MCP (Multiple Chip Package), or to POP (Package on Package).

It is only sufficient if the transistor used in the present invention is a field effect transistor (FET). It may thus be a MIS (Metal-Insulator Semiconductor) or TFT (Thin-Film Transistor), in addition to the MOS (Metal Oxide Semiconductor). Some of the transistors used in the system may also be bipolar transistors. A P-channel transistor is representative of a transistor of a second conductivity type, whilst an N-channel transistor is representative of a transistor of a first conductivity type.

The entire disclosure of the above mentioned Patent Document 1 is incorporated herein by reference thereto. In the framework of entire disclosure of the present invention (including the claims), and based on its basic technological idea, exemplary embodiments or examples of the present invention may be changed and/or adjusted. Also it should be noted that in the framework of the claims of the present invention, any combinations or selections of various elements disclosed herein are possible. That is, needless to say, it is understood by those skilled in the art that various changes or modifications can be made to the present invention based on the disclosure of the present invention including the claims and the technological idea of the present invention.

What is claimed is:

1. A method comprising:
   performing a first operation in response to a data read request in a first access mode, the first operation comprising:
   reading first data including M bits from a selected one of a plurality of memory banks each including a plurality of memory cells, M being an integer more than 1, and
   transferring the M bits of the first data respectively to M pieces of data terminals in parallel to each other; and
   performing a second operation in response to a data read request in a second access mode, the second operation comprising:
   reading second data including M bits from the memory banks, respectively, each of the M bits being stored in a different one of the memory banks, and
   transferring the M bits of the second data respectively to the data terminals in parallel to each other.

2. The method as claimed in claim 1, further comprising:
   performing a third operation in response to a data write request in the first access mode, the third operation comprising:
   transferring third data including M bits respectively from the data terminals in parallel to each other, and
   writing the third data into a selected one of the memory banks; and
   performing a fourth operation in response to a data write request in the second access mode, the fourth operation comprising:
   transferring fourth data including M bits respectively from the data terminals in parallel to each other, and
   writing the M bits of the fourth data into the memory banks, respectively, each of the M bits of the fourth data being written into a different one of the memory banks.

3. The method as claimed in claim 1, further comprising supporting a burst mode in performing each of the first and second operations so that:
   in the first operation, the first data comprises a plurality of sets each including M bits and being read out from the selected one of the memory banks, and the sets of the first data being transferred to the data terminals one set by one set in series; and;
   in the second operation, the second data comprises a plurality of sets each including M bits and being read out from the memory banks, and the sets of the third data being transferred to the data terminals one set by one set in series.

4. The device as claimed in claim 2, further comprising supporting a burst mode in performing each of the first, second, third and fourth operations so that:
   in the first operation, the first data comprises a plurality of sets each including M bits and being read out from the selected one of the memory banks, and the sets of the first data being transferred to the data terminals one set by one set in series;
   in the second operation, the second data comprises a plurality of sets each including M bits and being read out from the memory banks, and the sets of the third data being transferred to the data terminals one set by one set in series;
   in the third operation, the third data comprises a plurality of sets each including M bits and being transferred from the data terminals one set by one set in series, and each of the sets of the third data being written into the selected one of the memory banks; and
   in the fourth operation mode, the fourth data comprises a plurality of sets each including M bits and being transferred from the data terminals one set by one set in series, and each of the sets of the fourth data being written into the memory banks, respectively.

5. A method comprising:
   providing a memory device that comprises a plurality of memory banks each including a plurality of memory cells and M pieces of data terminals, M being an integer more than 1; and
   performing a first operation in response to a data read request in a first access mode, a second operation in response to a data write request in the first access mode, a third operation in response to a data read request in a second access mode, and a fourth operation in response to a data write request in the second access mode;
   the first operation being such that first data including M bits are read out from a selected one of the memory banks, and the M bits of the first data being transferred respectively to the data terminals in parallel to each other;
   the second operation being such that second data including M bits are transferred respectively from the data terminals in parallel to each other, and the second data being written into a selected one of the memory banks;
   the third operation being such that a plurality of sets of third data are read out from the memory banks, each of the sets of third data including M bits and being read out from a different one of the memory banks, and the sets of third data being transferred to the data terminals one set by one set in series; and
   the fourth operation being such that a plurality of sets of fourth data are transferred from the data terminals one set by one set in series, each of the sets of fourth data including M bits, and each of the sets of fourth data being written into a different one of the memory banks.

6. The method as claimed in claim 5,
   wherein the first data comprises a plurality of sets each including M bits and being read out from the selected one of the memory banks, and the sets of the first data being transferred to the data terminals one set by one set in series; and
   wherein in the second operation, the second data comprises a plurality of sets each including M bits and being transferred from the data terminals one set by one set in series, and each of the sets of the second data being written into the selected one of the memory banks.

7. The method as claimed in claim 6, further comprising a plurality of serializing circuits and a plurality of de-serializing circuits, the serializing circuits being activated in each of first and third operations, and the de-serializing circuits being activated in each of the second and fourth operations.

8. The device as claimed in claim 7, further comprising a plurality of switch circuits provided correspondingly to the memory banks, one of the switch circuits that is provided correspondingly to the selected one of the memory banks being activated in each of the first and second operations, and each of the switch circuits being activated in each of the third and fourth operations.

* * * * *